United States Patent
Krenzer et al.

(10) Patent No.: US 9,362,127 B2
(45) Date of Patent: Jun. 7, 2016

(54) METHOD FOR PROCESSING A WORKPIECE BY FORMING A POUROUS METAL LAYER

(71) Applicant: Infineon Technologies AG, Neubiberg (DE)

(72) Inventors: Michael Krenzer, Kelheim (DE); Thomas Kunstmann, Laaber (DE); Eva-Maria Hess, Gremsdorf (DE); Manfred Frank, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 13/948,208

(22) Filed: Jul. 23, 2013

(65) Prior Publication Data

US 2015/0031203 A1    Jan. 29, 2015

(51) Int. Cl.
*H01L 21/285* (2006.01)
*H01L 21/02* (2006.01)
*H01L 23/532* (2006.01)

(52) U.S. Cl.
CPC .... *H01L 21/28506* (2013.01); *H01L 21/02068* (2013.01); *H01L 23/53214* (2013.01); *H01L 23/53228* (2013.01); *H01L 23/53242* (2013.01)

(58) Field of Classification Search
CPC ....... H01L 24/743; H01L 24/32; H01L 24/83; H01L 24/29; H01L 24/27; H01L 21/0243; H01L 21/02532; H01L 21/02546; H01L 21/02598; H01L 29/42332; H01L 29/7888; H01L 21/02; H01L 21/285

USPC ............ 257/782, E21.499, E23.01; 438/106, 438/107, 123

See application file for complete search history.

(56) References Cited

U.S. PATENT DOCUMENTS

| | | | |
|---|---|---|---|
| 2005/0210672 A1* | 9/2005 | Reynolds | G02F 1/155 29/830 |
| 2012/0256323 A1* | 10/2012 | Engelhardt | C23C 4/08 257/782 |
| 2014/0033971 A1* | 2/2014 | Kramer | H01L 31/0516 118/301 |
| 2014/0242374 A1* | 8/2014 | Strasser | C23C 18/1644 428/307.7 |

OTHER PUBLICATIONS

Pierce, J.T.; Pritchard, J.P., Jr., "Dielectric Properties of Thin Insulating Films of Photoresist Material," Component Parts, IEEE Transactions on, vol. 12, No. 1, pp. 8,11, Mar. 1965.*

Mertens et al. "Post-etch residue and photoresist removal challenges for the 45 nm technology node and beyond;" Aug. 8, 2006, Semiconductor FabTech—31st Edition, pp. 86-97.*

* cited by examiner

*Primary Examiner* — Marc Armand
*Assistant Examiner* — Christina Sylvia
(74) *Attorney, Agent, or Firm* — Viering, Jentschura & Partner

(57) ABSTRACT

A method for processing a workpiece may include: providing a workpiece including a first region and a second region; forming a porous metal layer over the first region and the second region; wherein the first region and the second region are configured such that an adhesive force between the second region and the porous metal layer is lower than an adhesive force between the first region and the porous metal layer.

26 Claims, 3 Drawing Sheets

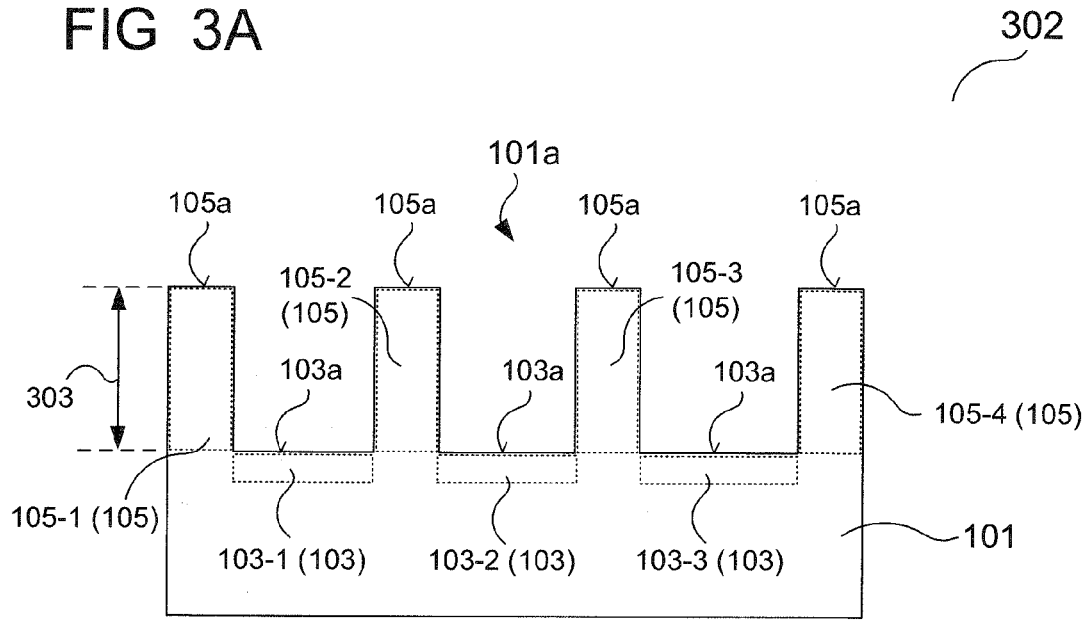
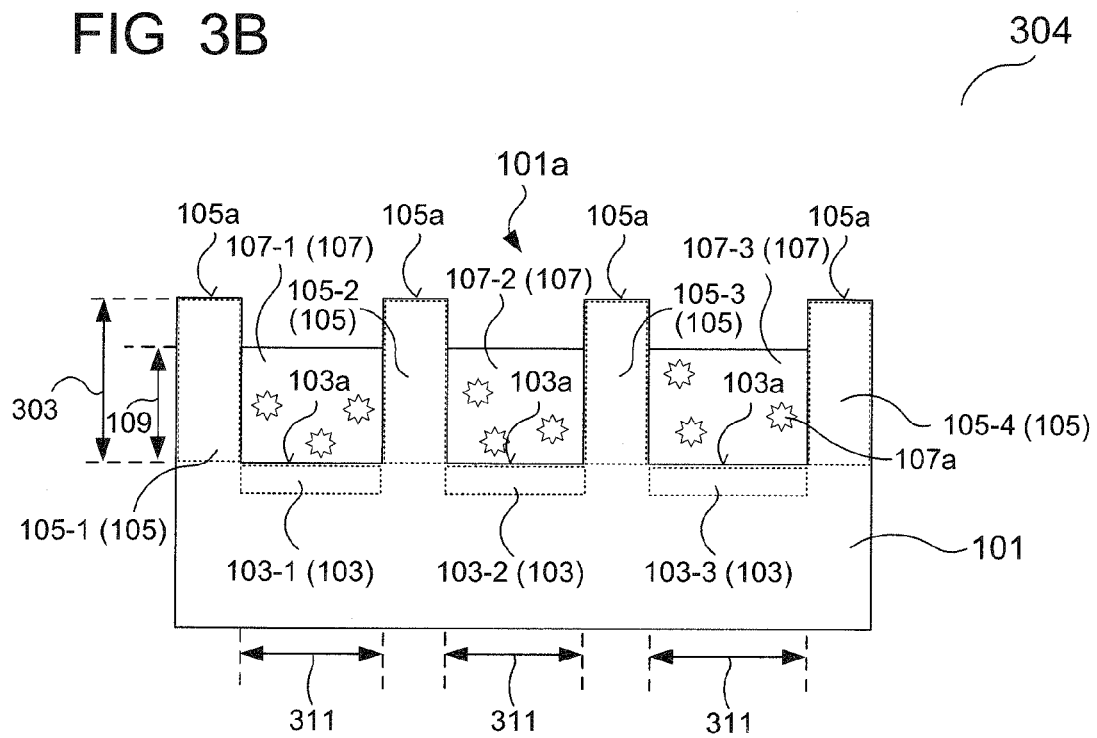

METHOD FOR PROCESSING A WORKPIECE BY FORMING A POUROUS METAL LAYER

TECHNICAL FIELD

Various embodiments relate to a method for processing a workpiece.

BACKGROUND

In the manufacturing process of semiconductor devices, metal layers may be deposited on workpieces or substrates like semiconductor wafers. These metal layers may then be structured to form for example interconnects, bonding pads, heat sinks or the like. Conventionally deposited metal layers, for example copper layers, may cause stress to a substrate, which may be undesirable in some circumstances. Similar problems may occur when depositing metal layers on other kind of substrates in other processes than semiconductor device manufacturing processes.

In recent years, the use of porous metal layers has been investigated. Porous metal layers may for example be formed (e.g. deposited) by plasma-based deposition methods or other methods, e.g. spray coating methods or printing methods (e.g., ink jet printing, stencil printing, or the like), and may exhibit varying porosity depending for example on the conditions during formation (e.g. deposition) of the metal layer. Porosity in this respect may refer to the percentage of the metal layer being occupied by voids ("pores"), a high porosity layer having a higher percentage of its volume occupied by such voids than a layer with a lower porosity. Such porous metal layers may in some cases have favorable properties, for example in terms of stress induced. However, integration of such porous metal layers in manufacturing processes, e.g., of silicon-based devices constitutes an obstacle to be solved, in particular the structuring of such layers.

Structuring of thick, porous metal layers, e.g. deposited with a plasma-based deposition method such as e.g. a plasma dust deposition process, may be difficult with common methods. Due to this problem the range of applications, e.g. in semiconductor industries or solar industries, for porous films may be limited.

SUMMARY

A method for processing a workpiece may include: providing a workpiece including a first region and a second region; forming (e.g. depositing) a porous metal layer over the first region and the second region; wherein the first region and the second region are configured such that an adhesive force between the second region and the porous metal layer is lower than an adhesive force between the first region and the porous metal layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A and 3B show schematic cross-sectional views illustrating a method for processing a workpiece in accordance with various embodiments.

DESCRIPTION

Figure 1A:
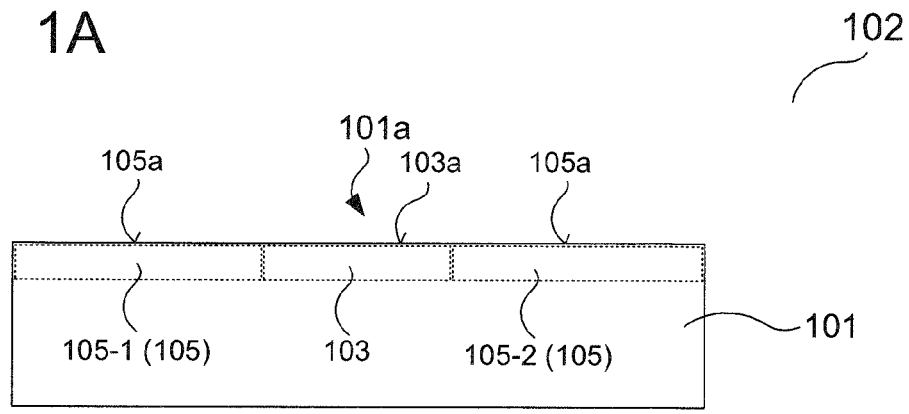
FIGS. 1A to 1C show schematic cross-sectional views illustrating a method for processing a workpiece in accordance with various embodiments.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Structuring of thick porous metal layers, e.g. deposited with a plasma-based deposition method such as e.g. a plasma dust deposition process, or deposited by means of a spray-coating process, or formed by means of a printing process such as e.g. ink jet printing, stencil printing, or the like, or formed by other methods, may be difficult with common methods. Due to this problem the range of applications, e.g. in semiconductor industries, for porous films may be limited.

Thick porous metal films, for example deposited by means of the plasma dust deposition technique, are not in use in the semiconductor industry so far. A structuring of these thick metal films may be impossible (or limited by the film thickness) using conventional techniques such as lift-off, damascene/CMP (chemical mechanical polishing), pattern-plating or etching (dry etch or wet etch).

Various embodiments may enable structuring of a porous metal layer without the use of a resist/mask or etching the porous metal layer. In accordance with one or more embodiments, a workpiece (e.g. a semiconductor workpiece, e.g. a substrate, e.g. semiconductor substrate, e.g. a wafer) may be divided in two areas or regions with different surfaces or surface characteristics. On one surface the deposited material may show good adhesion (for example, on a metal surface), whereas on the other surface (for example on a dielectric surface, e.g. an oxide or nitride surface) no or poor adhesion of the deposited material may be observed. In accordance with various embodiments, the different surfaces or surface characteristics may be obtained by using different materials in the two areas or regions. For example, one area or region may contain or consist of a material, with which the deposited material may form a strong bonding, whereas the other area or region may contain or consist of a material, with which the deposited material may form no or only a weak bonding. In accordance with some embodiments, the different surfaces or surface characteristics may be obtained by surface treatment of at least one portion (e.g. layer) of the workpiece, e.g. using one or more reactive gases such as, e.g., oxygen, nitrogen, ammonia, or the like. For example, in accordance with one or more embodiments, the workpiece may include a metal layer, e.g. a copper layer, wherein at least one portion of the surface of the metal layer (e.g. copper layer) may undergo a surface treatment to obtain, e.g., an oxidized surface or nitridized metal surface (e.g. oxidized or nitridized copper surface).

In accordance with one or more embodiments, the adhesive surface may mirror a structure that is desired for the deposited material, for example a structure of an interconnect or conductive track, a bonding pad, a heat sink, or the like. After deposition, the deposited material or layer on the non-adhesive areas may peel off or may be easily removable (e.g by a cleaning step, e.g. by brush cleaning, $CO_2$ snow cleaning, compressed air cleaning, or by a mechanical polishing step, or the like) in accordance with one or more embodiments.

Figure 1B:
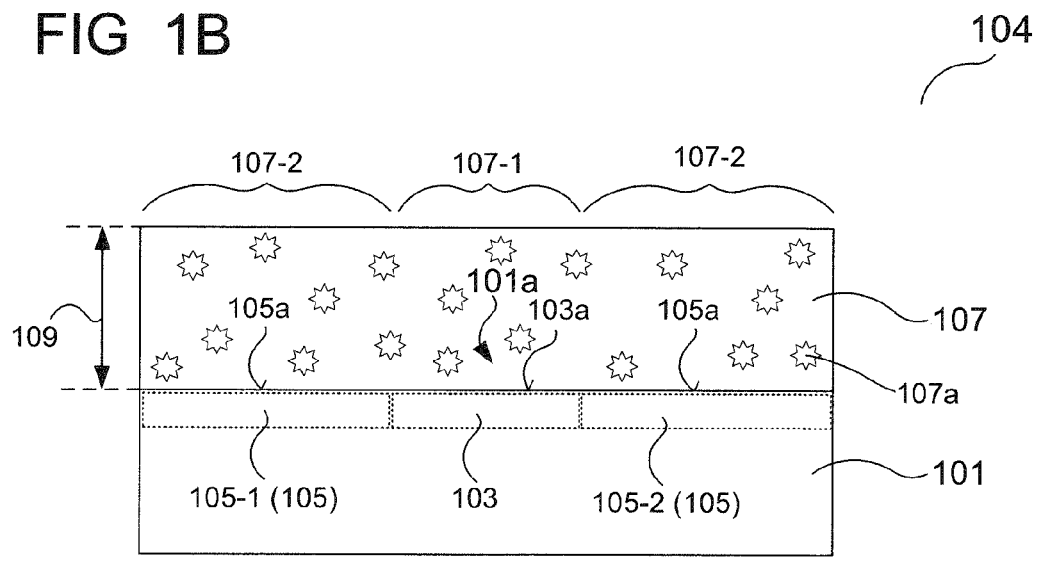
Figure 1C:
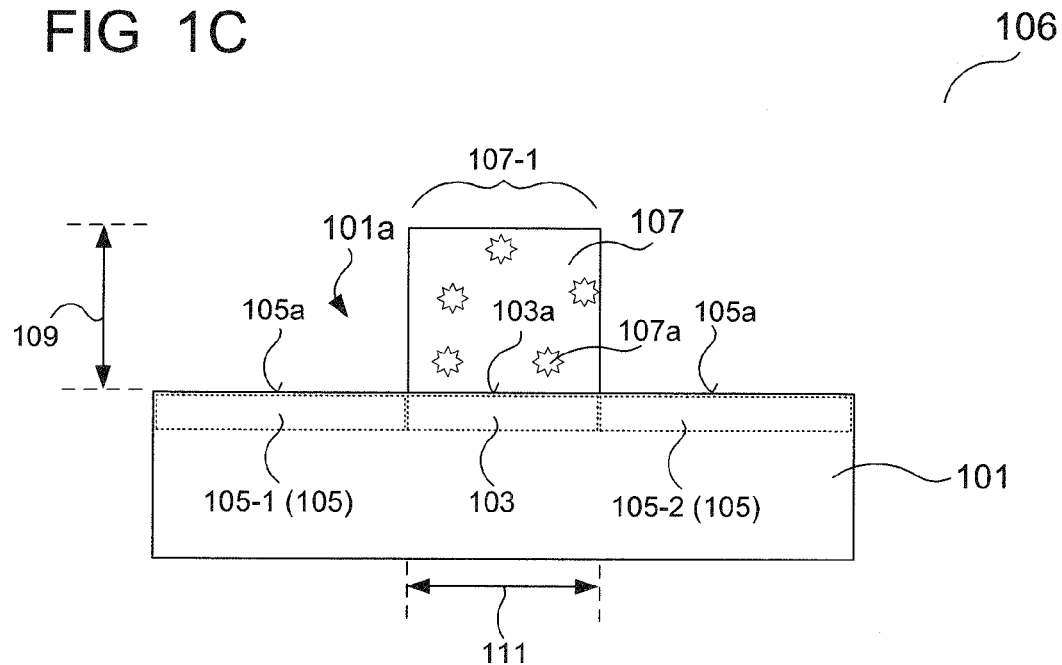

FIGS. 1A to 1C show schematic cross-sectional views illustrating a method for processing a workpiece in accordance with various embodiments.

As shown in FIG. 1A in a view 102, a workpiece 101 may be provided.

In accordance with one or more embodiments, the workpiece 101 may include or may be a semiconductor workpiece, for example a wafer, for example a silicon wafer, though wafers including or consisting of other semiconductor materials, including compound semiconductor materials (e.g. IV-IV, III-V, or II-VI compound semiconductor materials), such as, for example, germanium, silicon germanium, silicon carbide, gallium arsenide, gallium nitride, indium arsenide, indium gallium arsenide, or the like, may be possible as well. Alternatively or in addition, the workpiece 101 may include other materials or layers, for example dielectric materials or layers (e.g. oxide and/or nitride layers), or conductive materials such as metals or metal alloys.

The workpiece 101 may include a first region 103 and a second region 105.

In accordance with one or more embodiments, the first region 103 and the second region 105 may be disposed at a side 101a (e.g. at a surface) of the workpiece 101 (e.g. wafer). Side 101a may, for example, be an upper side of the workpiece 101, e.g. a front side or active side of a wafer, or a lower side of the workpiece 101, for example a back side of a wafer. Side 101a may include or may be a main processing surface of the workpiece 101 (e.g. wafer).

In accordance with one or more embodiments, the first region 103 and/or the second region 105 may include or may be a layer (e.g. a topmost layer) disposed at side 101a of the workpiece 101 (e.g. wafer). The workpiece 101 (e.g. wafer) may include one or more additional layers that may be disposed below the first region 103 and/or the second region 105.

In accordance with one or more embodiments, the second region 105 may be disposed adjacent (e.g. laterally adjacent) to the first region 103, for example having a common interface with the first region 103, as shown.

In accordance with one or more embodiments, the second region 105 may include at least two subregions 105-1, 105-2, for example a first subregion 105-1 and a second subregion 105-2, wherein the first region 103 may be disposed between (e.g. laterally between) the at least two subregions, for example between (e.g. laterally between) the first subregion 105-1 and the second subregion 105-2, as shown. For example, the first region 103 may have a common interface with at least one of (e.g. all of) the at least two subregions 105-1, 105-2 of the second region 105, e.g. with the first subregion 105-1 and/or the second subregion 105-2, e.g. with both the first subregion 105-1 and the second subregion 105-2, as shown.

In accordance with one or more embodiments, the first region 103 may include at least two subregions, wherein the second region 105 may be disposed between (e.g. laterally between) the at least two subregions (not shown). For example, the second region 105 may have a common interface with at least one of (e.g. all of) the at least two subregions of the first region 103.

In accordance with one or more embodiments, both the first region 103 and the second region 105 may include at least two subregions, wherein a subregion of the first region 103 may be disposed between (e.g. laterally between) two subregions of the second region 105, and/or vice versa (not shown, see e.g. FIG. 3A).

In accordance with one or more embodiments, a surface 103a (e.g. an upper surface) of the first region 103 may be flush, or at least substantially flush, with a surface 105a (e.g. an upper surface) of the second region 105 (e.g. with a surface 105a of at least one of the at least two subregions 105-1, 105-2 of the second region 105, as shown). In accordance with one or more embodiments, a height difference between the surfaces 103a and 105a may be less than or equal to about 1 mm, e.g. less than or equal to about 100 µm, e.g. less than or equal to about 10 µm, e.g. less than or equal to about 5 µm, e.g. less than or equal to about 1 µm, e.g. less than or equal to about 500 nm, e.g. less than or equal to about 100 nm, e.g. less than or equal to about 10 nm. In accordance with other embodiments, the height difference may have a different value, e.g. greater than about 1 mm.

In accordance with other embodiments, the first region 103 or the second region 105 (e.g. at least one of the at least two subregions 105-1, 105-2 of the second region 105) may protrude from the workpiece 101, e.g. from side 101a (e.g. main processing surface) of the workpiece 101 (not shown, see e.g. FIG. 3A).

As shown in FIG. 1B in a view 104, a porous metal layer 107 may be deposited over the first region 103 and the second region 105 of the workpiece 101, for example over the surface 103a (e.g. upper surface) of the first region 103 and the surface 105a (e.g. upper surface) of the second region 105 (e.g. of the at least two subregions 105-1, 105-2 of the second region 105). For example, after deposition of the porous metal layer 107, a first portion 107-1 of the porous metal layer 107 may be disposed over the first region 103 of the workpiece 101 and a second portion 107-2 of the porous metal layer 107 may be disposed over the second region 105 of the workpiece 101, e.g. over one or more (e.g. all) of the at least two subregions 105-1, 105-2 of the second region 105, as shown.

Pores of porous metal layer 107 are symbolized by star-shaped voids 107a. However, this shape is chosen only for illustration purposes.

In accordance with one or more embodiments, depositing the porous metal layer 107 over the first region 103 and the second region 105 may include or may be achieved by a plasma dust deposition process.

In such a process, a plasma deposition may be used in which a plasma jet and/or an activated carrier gas and/or a particle stream may be generated, e.g., using a low temperature compared to processes like plasma/flame spraying and in which the speed of the activated particles may be low compared to processes like plasma spraying or cold gas spraying. The particles to be deposited, in particular metal particles like copper particles, tin particles, aluminum particles, silver particles, gold particles, tin copper particles, tin silver particles, tin gold particles, or the like, may be supplied in powder form to the plasma jet using for example a carrier gas.

For generating the plasma jet, for example, a discharge between two electrodes may be used. To achieve this, for example, a voltage may be supplied to the electrodes, which may be separated by a dielectric material. For example, the dielectric material may be an isolation pipe where one electrode is provided within the pipe and another electrode is provided outside the pipe.

In operation, in such an apparatus a glow discharge may result. By supplying a processing gas which streams through the device, which may be in form of a tube, a plasma jet may be generated which may be mixed with the carrier gas. The carrier gas as mentioned above may include the particles used for coating a surface of a workpiece or substrate, i.e., particles to be deposited on the surface, in this case metal particles. In various embodiments, the mixing may be carried out in a reaction zone outside of the part of the device generating the plasma jet. In the reaction zone, energy of the plasma may be transferred to the carrier gas and/or the particles included in the carrier gas. For example, the particles included in the carrier gas may be activated by the mixing of the carrier gas with the plasma jet in the reaction zone such that for example a stream or jet of activated particles may be generated. In some embodiments, a plurality of reaction zones may be provided.

As this is a conventional technique for deposition of porous metals, it will not be described in greater detail here. Other techniques for depositing porous metal layers may be used as well.

For example, in accordance with other embodiments, depositing the porous metal layer 107 over the first region 103 and the second region 105 may include or may be achieved by a spray coating process, for example at least one of thermal spraying, plasma spraying, cold gas spraying, and flame spraying. In accordance with other embodiments, the porous metal layer 107 may be formed over the first region 103 and the second region 105 by means of a printing process such as, e.g., ink jet printing, stencil printing, or the like.

In accordance with one or more embodiments, the porous metal layer 107 may have a porosity of less than or equal to about 90%, e.g. less than or equal to about 60%, e.g. less than or equal to about 30%, e.g. in the range from about 5% to about 90%, e.g. in the range from about 15% to about 60%, e.g. in the range from about 25% to about 50%, e.g. in the range from about 30% to about 45%, e.g. about 40%, e.g. about 30%, though other values of the porosity may be possible as well. The porosity may, for example, be selected by adjusting processing conditions accordingly. The porosity may, for example, be selected to achieve desired properties, e.g. desired mechanical properties such as, e.g., stress properties, and/or desired electrical properties, of the metal layer 107. This process of setting desired mechanical and/or electrical material properties may sometimes also be referred to as "mechanical engineering" or "electrical engineering".

In accordance with one or more embodiments, the porous metal layer 107 may have a a thickness (indicated by arrow 109 in FIG. 1B) of greater than or equal to about 10 μm, e.g. greater than or equal to about 20 μm, e.g. greater than or equal to about 50 μm, e.g. greater than or equal to about 100 μm, e.g. greater than or equal to about 500 μm, e.g. in the range from about 10 μm to about 1000 μm, e.g. in the range from about 10 μm to about 500 μm, e.g. in the range from about 10 μm to about 100 μm, e.g. in the range from about 10 μm to about 50 μm, though other values of the thickness 109 may be possible as well, for example less than 10 μm or greater than 1000 μm. The thickness 109 may, for example, be selected by adjusting processing conditions accordingly. The thickness 109 may, for example, be selected to achieve desired properties, e.g. stress properties, of the metal layer 107.

Such porous metal layers may have favorable properties regarding stress compared to metal layers deposited for example by physical vapor deposition (PVD) or electro-chemical deposition (ECD).

The porous metal layer 107 may contain or consist of a metal and/or a metal alloy, for example a metal and/or metal alloy having a comparatively low melting point, for example a melting point of less than or equal to about 1100° C.

In accordance with one or more embodiments, the porous metal layer 107 may contain or may consist of at least one material selected from the following group of materials, the group consisting of: copper, tin, aluminum, silver, gold, an alloy containing one or more of the aforementioned materials, for example an alloy containing at least 50% or at least 80% of copper or of another one of the aforementioned materials, for example an alloy containing copper and tin, for example an alloy containing gold and tin, for example an alloy containing silver and tin.

In accordance with one or more embodiments, the porous metal layer 107 may be contiguous, e.g. immediately after the deposition process has terminated. For example, immediately after deposition, the porous metal layer 107 may cover the entire side 101a of the workpiece 101 (e.g. front side or back side of the wafer, e.g. main processing surface) in accordance with some embodiments, or the entire surface 103a of the first region 103 and at least a part of the surface 105a of the second region 105 (e.g. the entire surface 105a of the second region 105) in accordance with some embodiments.

The first region 103 and the second region 105 may be configured such that an adhesive force between the second region 105 (for example, the surface 105a of the second region 105) and the porous metal layer 107 (for example, a surface of the porous metal layer 107 facing the second region 105) is lower than an adhesive force between the first region 103 (for example, the surface 103a of the first region 103) and the porous metal layer 107 (for example, a surface of the porous metal layer 107 facing the first region 103). In other words, an adhesive force between the second region 105 (or surface 105a) and the porous metal layer 107 (or the surface of the porous metal layer 107 facing the second region 105) may be smaller (in other words, weaker) than an adhesive force between the first region 103 (or surface 103a) and the porous metal layer 107 (or the surface of the porous metal layer 107 facing the first region 103).

In accordance with one or more embodiments, the first region 103 may contain (e.g. consist of) a first material and the second region may contain (e.g. consist of) a second material that is different from the first material, wherein the first material and the second material may be selected such that the adhesive force between the second region 105 and the porous metal layer 107 is lower than the adhesive force between the first region 103 and the porous metal layer 107.

In accordance with one or more embodiments, forming the first region 103 and the second region 105 having different adhesive forces may include or may be achieved by one or more layer deposition and/or patterning (e.g. photopatterning) processes. In accordance with one or more embodiments, forming the first region 103 and the second region 105 may include or may be achieved by surface treatment of the workpiece 101 (e.g. using one or more reactive gases), e.g. by different surface conditioning of different areas of the workpiece 101 to obtain the first and second regions 103, 105 having different adhesive forces. Alternatively or in addition, forming the first region 103 and the second region 105 may include or may be achieved by other processes that are suitable to obtain regions having different adhesive properties, and which may be known as such in the art.

In accordance with one or more embodiments, the adhesive force between the second region 105 and the porous metal layer 107 may be such that the porous metal layer 107 (e.g. the second portion 107-2 of the porous metal layer 107) peels off the second region 105 after depositing the porous metal layer 107 over the first region 103 and the second region 105, for example with no or substantially no external force applied to the porous metal layer 107. In other words, the adhesive force between the second region 105 and the porous metal layer 107 may be so low that the porous metal layer 107 does not stick on the second region 105 or may be easily removed from the second region 105, for example by means of a cleaning process or by cooling the workpiece 101 (as will be described in more detail further below).

In accordance with one or more embodiments, the adhesive force between the second region 105 and the porous metal layer 107 (e.g. the second region 107-2 of the porous metal layer 107) may be such that the porous metal layer 107 (e.g. the second portion 107-2 of the porous metal layer 107) may detach from the second region 105 upon application of a force (e.g. tractive force) of less than or equal to about 50 kg/cm$^2$, e.g. less than or equal to about 25 kg/cm$^2$ in some embodiments, e.g. less than or equal to about 10 kg/cm$^2$ in some embodiments, to the porous metal layer 107 (e.g. the second region 107-2 of the porous metal layer 107) in a stamp pull-off test.

In accordance with one or more embodiments, the term "stamp pull-off test" may refer to a test, in which a stamp may be attached to a first element (e.g. the porous metal layer 107) that is attached to a second element (e.g. the workpiece 101), and subsequently an increasing force (tractive force) may be applied to the stamp, and thus to the first element (e.g. the porous metal layer 107) to pull the stamp (and thus the first element) off the second element (e.g. the workpiece 101), wherein the value of the force at which the first element (e.g. the porous metal layer 107) eventually detaches from the second element (e.g. the workpiece 101) may characterize the adhesive force or strength between the first element (e.g. porous metal layer 107) and the second element (e.g. workpiece 101). In this context, the term "less than or equal to about 50 kg/cm$^2$" may be understood as meaning that a force of less than or equal to about 50 kg/cm$^2$ would be sufficient to detach the porous metal layer 107 (e.g. the second portion 107-2 of the porous metal layer 107) from the second region 105 in a stamp pull-off test.

In contrast thereto, the adhesive force between the first region 103 and the porous metal layer 107 (e.g. the first portion 107-1 of the porous metal layer 107) may be greater, for example significantly greater, than the adhesive force between the second region 105 and the porous metal layer 107 (e.g. the second portion 107-2 of the porous metal layer 107).

For example, in accordance with one or more embodiments, the adhesive force between the first region 103 and the porous metal layer 107 may be at least two times, e.g. at least five times, e.g. at least ten times, or even more times, the adhesive force between the second region 105 and the porous metal layer 107.

In accordance with one or more embodiments, the adhesive force between the first region 103 and the porous metal layer 107 is such that the porous metal layer 107 (e.g. the first portion 107-1 of the porous metal layer 107) may withstand a force of greater than or equal to about 100 kg/cm$^2$ applied to the porous metal layer 107 (e.g. the first portion 107-1 of the porous metal layer 107) in a stamp pull-off test, without detaching from the first region 103.

In accordance with one or more embodiments, the first material (of the first region 103) may contain or may be at least one of a metal and a metal alloy.

In accordance with one or more embodiments, the first material (of the first region 103) may contain or may be the same material, e.g. the same metal or metal alloy, as the porous metal layer 107. For example, the first material may contain or may be copper and the porous metal layer 107 may also contain or consist of copper.

In accordance with one or more embodiments, the first region 103 may include or may be configured as a seed region or seed layer, or may contain or consist of a seed metal or metal alloy.

In accordance with one or more embodiments, the first region 103, e.g. the seed region or seed layer, may include or may be a non-porous metal layer.

In accordance with one or more embodiments, the second material (of the second region 105) may contain or may be a dielectric material, for example an oxide (e.g. $SiO_2$ or glass) and/or a nitride (e.g. $Si_3N_4$). For example, the second region 105 may include or may be an oxidized metal layer or surface, e.g. an oxidized copper layer or surface.

In accordance with one or more embodiments, the second material (of the second region 105) may contain or may be a resist material, for example a negative or positive photorest, such as SU-8 (e.g. WBER 40 by MicroChemicals GmbH) or the like.

In accordance with one or more embodiments, the second region 105 may include or may be a carbon containing layer (e.g. a layer containing or consisting of diamond-like carbon, a-C:H (hydrogen-containing amorphous carbon), or the like).

As shown in FIG. 1C in a cross-sectional view 106, the porous metal layer 107 (e.g. the second portion 107-2 of the porous metal layer 107) may be removed from the second region 105 of the workpiece 101 after depositing the porous metal layer 107 over the first region 103 and the second region 105.

As described herein above, the adhesive force between the second region 105 and the porous metal layer 107 may be smaller, for example significantly smaller, than the adhesive force between the first region 103 and the porous metal layer 107. Therefore, the porous metal layer 107 (e.g. the second portion of the porous metal layer 107) may only loosely stick to the second region 105 and may, for example, simply peel off the second region 105 or may be easily removed by application of small external impact, e.g. small mechanical impact, provided e.g. by means of a surface cleaning process, in other words by cleaning the workpiece 101 (for example, the side 101a or surface of the workpiece 101), for example brush cleaning, $CO_2$ snow cleaning, compressed air cleaning, or by means of a mechanical polishing process, or the like.

In accordance with one or more embodiments, the workpiece 101 may be cooled after deposition of the porous metal layer 107. This may generate mechanical stress in the porous metal layer 107 (e.g. the second portion 107-2 of the porous metal layer 107) and/or in the second region 105 (due a difference in the CTE (coefficient of thermal expansion) of the materials of the porous metal layer 107 and the second region 105) and thus cause the porous metal layer 107 (e.g. the second portion 107-2 of the porous metal layer 107) to peel off the second region 105.

While the porous metal layer 107 may be removed easily from the second region 105, the porous metal layer 107 may remain over the first region 103 due to the larger adhesive force between the first region 103 and the porous metal layer 107 compared to the adhesive force between the second region 105 and the porous metal layer 107, as shown.

Thus, in accordance with one or more embodiments, a portion of the porous metal layer 107 disposed over the second region 105 of the workpiece 101 (e.g. the second portion 107-2 of the porous metal layer 107) may be removed while another portion of the porous metal layer 107 disposed over the first region 103 of the workpiece 101 (e.g. the first portion 107-1 of the porous metal layer 107) may remain, due to a difference in an adhesive force or bonding strength. Thus, in accordance with one or more embodiments, a structured porous metal layer 107 may be obtained without the use of a mask or etching the porous metal layer 107.

In accordance with one or more embodiments, the structured porous metal layer 107, e.g. the first portion 107-1 of the porous metal layer 107, may be configured as a metallization area (e.g. a front side or back side metallization, an interconnect, a bonding pad, or the like) of, e.g., a chip or die. In accordance with one or more embodiments, the structured porous metal layer 107, e.g. the first portion 107-1 of the porous metal layer 107, may be configured as a thermally conductive structure, e.g. a heat sink, of, e.g., a chip or die.

In accordance with one or more embodiments, a size, e.g. a diameter, a width and/or a length, (indicated by arrow 111 in FIG. 1C) of at least one portion (e.g. the first portion 107-1) of the structured porous metal layer 107 may be in the range from about 10 μm to about 5000 μm, e.g. from about 10 μm to about 1000 μm, for example in the range from about 25 μm to about 500 μm, for example in the range from about 50 μm to about 200 μm, for example about 50 μm, for example about 100 μm, although other values may be possible as well, for example less than 10 μm or greater than 5000 μm.

It should be noted that in accordance with various embodiments, after deposition of the porous metal layer 107, a (lateral) bonding strength between the second portion 107-2 and the first portion 107-1 of the porous metal layer 107 shown in FIG. 1B may be comparatively low compared to a bonding strength (adhesive force) between the first portion 107-1 of the porous metal layer 107 and the first region 103 of the workpiece 101, such that the second portion 107-2 of the porous metal layer 107 may detach from the first portion 107-1 of the porous metal layer 107 while the first portion 107-1 of the porous metal layer 107 may remain attached to the first region 103 of the workpiece 101.

In accordance with one or more embodiments, the workpiece 101 may undergo additional processing steps after the structured porous metal layer 107 has been formed, for example one or more back end processing steps, e.g. one or more chip packaging process steps, e.g. one or more cleaning steps, e.g. one or more annealing steps, e.g. one or more surface treatment steps (e.g. sealing), or the like.

Figure 2:
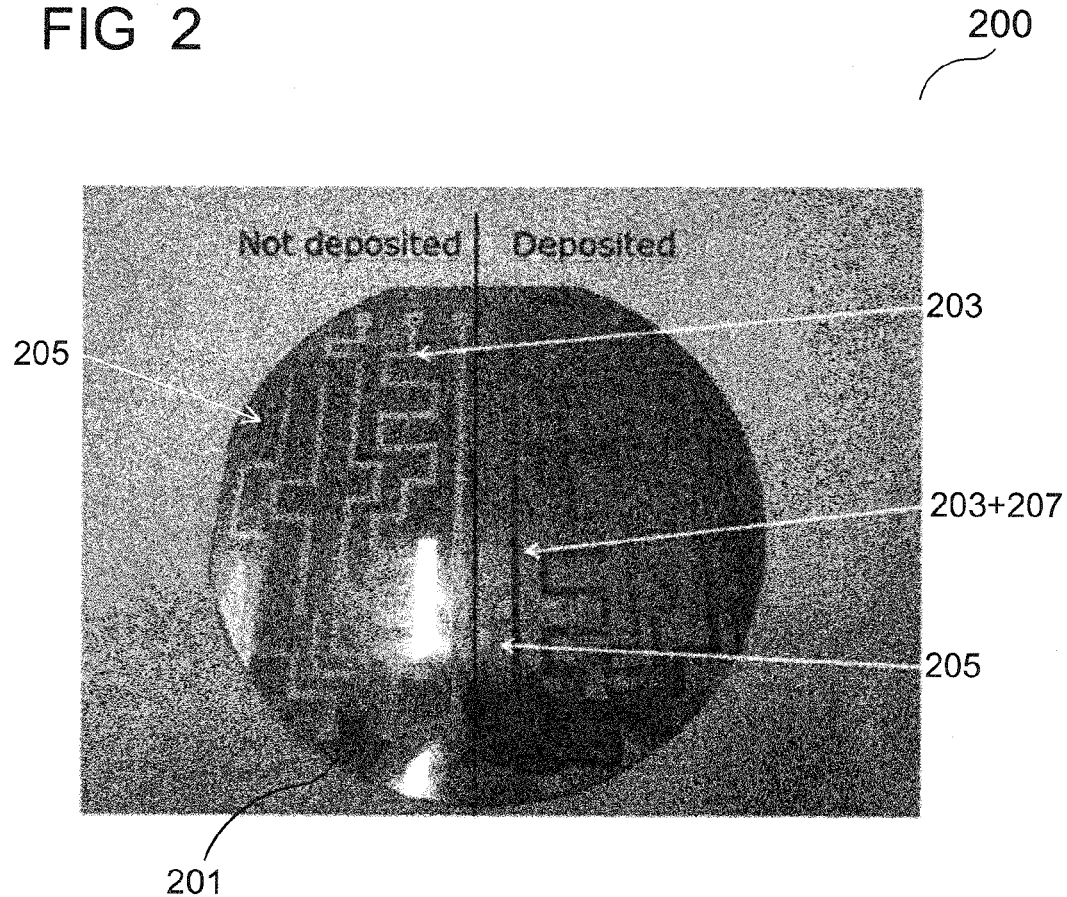
FIG. 2 shows a photograph of a wafer for illustrating aspects of one or more embodiments.

FIG. 2 shows a photograph 200 of a wafer 201 (as an example of a workpiece) for illustrating aspects of one or more embodiments.

The wafer 201 includes a first region 203 and a second region 205. A porous metal layer 207 (for example, porous copper layer) has been deposited over a half of the wafer 201 (i.e. the right half in FIG. 2, labelled "Deposited"), by means of a plasma-dust deposition process, while another half of the wafer 201 (i.e. the left half in FIG. 2, labelled "Not deposited") has been blocked from deposition.

First region 203 and second region 205 may be similar to first region 103 and second region 105, respectively, shown in FIGS. 1A-1C and may be configured such that an adhesive force between the second region 205 and the porous metal layer 207 is lower than an adhesive force between the first region 203 and the porous metal layer 207. For example, first region 203 may contain or consist of a first material (e.g. a metal or metal alloy, e.g. silver), to which the porous metal layer 207 adheres strongly, while the second region 205 may contain a second material (e.g. a dielectric), to which the porous metal layer 207 adheres poorly or not at all.

Illustratively, the left half of the wafer 201 ("Not deposited") shows a processing stage of the wafer 201, in particular of adhesive areas (i.e. first region 203) and non-adhesive areas (i.e. second region 205) of the wafer 201, before deposition of the porous metal layer 207, while the right half of the wafer 201 ("Deposited") shows a processing stage of the wafer 201, in particular of the adhesive areas (first region 203) and non-adhesive areas (second region 205) of the wafer 201, after deposition of the porous metal layer 207.

As may be seen from the right half of the wafer 201 ("Deposited"), after deposition of the porous metal layer 207, the porous metal layer 207 may stick only on the adhesive areas (first region 203) of the wafer 201, while the non-adhesive areas (second region 205) of the wafer 201 may be free or at least substantially free from material of the porous metal layer 207.

As explained above, this may be due to the different adhesive forces between the first region 203 and the porous metal layer 207 on the one hand and between the second region 205 and the porous metal layer 207 on the other hand. Due to the smaller adhesive force between the second region 205 and the porous metal layer 207, the porous metal layer 207 may peel off or may be easily removed from the second region 205, e.g. by means of a cleaning process, e.g. brush cleaning, $CO_2$ snow cleaning, compressed air cleaning, or the like, or by means of a mechanical polishing process, or the like, after deposition of the porous metal layer 207. In accordance with one or more embodiments, the cleaning process, mechanical polishing process, or the like may not, or only marginally, affect the portion of the porous metal layer 207 that is disposed on the adhesive areas (first region 203) of the wafer 201.

As may be seen from FIG. 2, the deposited porous metal layer 207 may mirror a structure of the underlying adhesive areas (first region 203) of the wafer 201. For example, a cross-sectional area of the structured porous metal layer 207 may correspond to the underlying areas (first region 203) of the wafer 201.

FIGS. 3A and 3B show schematic cross-sectional views illustrating a method for processing a workpiece in accordance with various embodiments. Reference signs that are the same as in FIGS. 1A to 1C may denote the same or similar elements as there and will not be described in detail again here for sake of brevity. Reference is made to the description above.

As shown in FIG. 3A in a view 302, a workpiece 101 (e.g. a wafer) may be provided.

The workpiece 101 may be to some degree similar to the workpiece 101 shown in FIGS. 1A and 1C, and only differences between the two workpieces 101 will be described in the following.

The workpiece 101 shown in FIG. 3A may include the first region 103 and the second region 105, wherein the second region 105 may protrude from side 101a (e.g. main processing surface) of the workpiece 101.

In accordance with one or more embodiments, the second region 105 may include a plurality of subregions 105-1, 105-2, 105-2, 105-4 protruding from side 101a (e.g. main processing surface) of the workpiece 101, as shown. Four subregions 105-1, 105-2, 105-3, 105-4 are shown as an example, however the number of subregions may be less than four or may be greater than four in accordance with other embodiments. The sub-regions 105-1, 105-2, 105-3, 105-4 may include or may be configured as protrusions or protruding structures such as e.g. pillars, ridges, walls, banks, fins, or the like.

In accordance with one or more embodiments, the first region 103 may include a plurality of subregions 103-1, 103-2, 103-3, as shown. Three subregions 103-1, 103-2, 103-3 are shown as an example, however the number of subregions may be less than three or may be greater than three in accordance with other embodiments.

A subregion of the first region 103 may be disposed between (e.g. laterally between) two subregions of the second region 105 and/or vice versa. For example, subregion 103-1 of the first region 103 may be disposed between (e.g. laterally between) subregions 105-1 and 105-2 of the second region 105, subregion 103-2 of the first region 103 may be disposed between (e.g. laterally between) subregions 105-2 and 105-3 of the second region 105, and subregion 103-3 of the first region 103 may be disposed between (e.g. laterally between) subregions 105-3 and 105-4 of the second region 105, as shown in FIG. 3A.

In accordance with one or more embodiments, forming the first region 103 and the second region 105 having different adhesive forces may include or may be achieved by one or more layer deposition and/or patterning (e.g. photopatterning) processes. In accordance with one or more embodiments, forming the first region 103 and the second region 105 may include or may be achieved by surface treatment of the workpiece 101 (e.g. using one or more reactive gases), e.g. by different surface conditioning of different areas of the workpiece 101 to obtain the first and second regions 103, 105 having different adhesive forces. Alternatively or in addition, forming the first region 103 and the second region 105 may include or may be achieved by other processes that are suitable to obtain regions having different adhesive properties, and which may be known as such in the art.

A height difference (indicated by arrow 303 in FIG. 3A) between a surface 103a (e.g. upper surface) of the first region 103 (or of at least one subregion of the first region 103, e.g. all subregions of the first region 103) and a surface 105a (e.g. upper surface) of the second region 105 (or of at least one subregion of the second region 105, e.g. all subregions of the second region 105) may, for example, be determined according to a thickness 109 of a porous metal layer 107 to be deposited, and may, for example, be greater than or equal to the thickness 109 of the porous metal layer 107 (see FIG. 3B), though the thickness 109 of the porous metal layer 107 may also be greater than the height difference 303 in accordance with other embodiments.

In accordance with one or more embodiments, the height difference 303 may be greater than or equal to about 10 µm, e.g. greater than or equal to about 25 µm, e.g. greater than or equal to about 50 µm, e.g. greater than or equal to about 100 µm, e.g. greater than or equal to about 250 µm, e.g. greater than or equal to about 500 µm, although other values may be possible as well.

The first region 103 and the second region 105 may be configured such that an adhesive force between the second region 105 and the porous metal layer 107 to be deposited is lower than an adhesive force between the first region 103 and the porous metal layer 107, similarly as described above.

The first region 103 and the second region 105 may include or may consist of different materials. For example, the second region 105 may contain or may consist of a material, to which the porous metal layer 107 adheres less strongly. For example, the second region 105 may contain or may consist of a dielectric (e.g. an oxide or nitride) or a resist material, while the first region may, for example, contain or consist of a metal or metal alloy (e.g. the same metal or metal alloy as that of the porous metal layer 107 to be deposited, e.g. a seed metal).

As shown in FIG. 3B in a view 304, the porous metal layer 107 may be deposited, wherein after deposition the porous metal layer 107 may stick only to the first region 103 of the workpiece 101, while portions of the porous metal layer 107 disposed over the second region 105 may peel off or may be easily removed from the second region 105, for example by means of a cleaning process (e.g. brush cleaning, $CO_2$ snow cleaning, compressed air cleaning, or the like) or by means of cooling the workpiece 101, similarly as described above.

As shown in FIG. 3B, a structured porous metal layer 107 may be obtained, wherein the structured porous metal layer 107 may include a plurality of subregions 107-1, 107-2, 107-3. Three subregions 107-1, 107-2, 107-3 are shown as an example, however the number of subregions of the structure porous metal layer 107 may be less than three or may be greater than three in accordance with other embodiments. One or more, e.g. all, of the subregions 107-1, 107-2, 107-3 may, for example, be configured as a metallization area (e.g. a front side or back side metallization, an interconnect, a bonding pad, or the like) of, e.g., a chip or die. Alternatively, or in addition, one or more, e.g. all, of the subregions 107-1, 107-2, 107-3 may be configured as a thermally conductive structure, e.g. a heat sink, of, e.g., a chip or die.

In accordance with one or more embodiments, a size, e.g. a diameter, e.g. a width and/or length, (indicated by arrows 311 in FIG. 3B) of at least one of the subregions 107-1, 107-2, 107-3 may be similar to the size 111 described herein above in connection with FIG. 1C. In accordance with other embodiments, the size 311 may be different. In accordance with one or more embodiments, a size, e.g. a diameter, e.g. a width and/or length of at least one of the subregions 105-1, 105-2, 105-3, 105-4 may, for example, be in the range from about 10 µm to about 5 mm, e.g. in the range from about 50 µm to about 5 mm, although other values may be possible as well.

In accordance with one or more embodiments, the workpiece 101 may undergo additional processing steps after the structured porous metal layer 107 has been formed, for example one or more back end processing steps, e.g. one or more chip packaging process steps, e.g. one or more cleaning steps, e.g. one or more annealing steps, e.g. one or more surface treatment steps (e.g. sealing), or the like.

In the embodiment shown in FIGS. 3A and 3B, the second region 105 is shown to protrude from the workpiece 101. In accordance with other embodiments, it may be possible that the first region 103 protrudes from the workpiece 101.

In accordance with various embodiments, methods for structuring porous metal layers are provided. Metal layers structured in this manner may have various effects in some embodiments, for example low manufacturing costs, reliability of the structuring, low process temperatures, for example, process temperatures below 400° C., or below 250° C. or below 200° C., reduction of wafer bending due to the reduced stress induced, good thermal conductivity and/or good electrical properties. In accordance with various embodiments, mechanical engineering and/or electrical engineering of the metal layers may be achieved by selecting the porosity of the metal layers.

A method for processing a workpiece in accordance with various embodiments may include: providing a workpiece including a first region and a second region; depositing a porous metal layer over the first region and the second region, wherein the first region and the second region are configured such that the porous metal layer detaches more easily from the second region than from the first region.

A method for processing a workpiece in accordance with various embodiments may include: providing a workpiece including a first region and a second region, wherein the first region contains or consists of a first material and the second region contains or consists of a second material that is different from the first material; depositing a porous metal layer over the first region and the second region; wherein the first material and the second material are selected such that the porous metal layer detaches more easily from the second region than from the first region.

A method for processing a workpiece in accordance with various embodiments may include: providing a workpiece including a first region and a second region; depositing a porous metal layer over the first region and the second region, wherein the first region has a greater bonding strength to the porous metal layer than the second region.

A method for processing a workpiece in accordance with various embodiments may include: providing a workpiece including a first region and a second region, wherein the first region contains or consists of a first material and the second region contains or consists of a second material that is different from the first material; depositing a porous metal layer over the first region and the second region, wherein the first material has a greater bonding strength to the porous metal layer than the second material.

A method for processing a workpiece in accordance with various embodiments may include: providing a workpiece including a first region and a second region, wherein the first region contains or consists of a first material and the second region contains or consists of a second material that is different from the first material; depositing a metal layer over the first region and the second region by means of at least one of a spray coating process and a plasma-based deposition process, wherein the first material and the second material are configured such that an adhesive force between the second material and the metal layer is lower than an adhesive force between the first material and the metal layer.

In accordance with one or more embodiments, the metal layer may be configured as a porous metal layer.

In accordance with one or more embodiments, depositing the metal layer over the first region and the second region may include or be achieved by a plasma-dust deposition process.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a workpiece, the method comprising:
   providing a workpiece comprising a first region and a second region;
   forming a porous metal layer over the first region and the second region;
   wherein the first region and the second region are configured such that an adhesive force between the second region and the porous metal layer is lower than an adhesive force between the first region and the porous metal layer,
   wherein at least one of the following conditions is satisfied:
   1) the adhesive force between the second region and the porous metal layer is such that the porous metal layer detaches from the second region upon application of a force of less than or equal to about 50 kg/cm$^2$ to the porous metal layer in a stamp pull-off test,
   2) the adhesive force between the first region and the porous metal layer is such that the porous metal layer withstands a force of greater than or equal to about 100 kg/cm$^2$ applied to the porous metal layer in a stamp pull-off test, without detaching from the first region.

2. The method of claim 1, wherein the first region comprises a first material and the second region comprises a second material that is different from the first material,
   wherein the first material and the second material are selected such that the adhesive force between the second region and the porous metal layer is lower than the adhesive force between the first region and the porous metal layer.

3. The method of claim 2, wherein the first material comprises at least one of a metal and a metal alloy.

4. The method of claim 2, wherein the first material comprises the same material as the porous metal layer.

5. The method of claim 2, wherein the second material comprises a dielectric material.

6. The method of claim 2, wherein the second material comprises a resist material.

7. The method of claim 1, wherein forming the porous metal layer over the first region and the second region comprises a plasma dust deposition process.

8. The method of claim 1, wherein forming the porous metal layer over the first region and the second region comprises a spray coating process.

9. The method of claim 8, wherein the spray coating process comprises at least one of the following: thermal spraying, plasma spraying, cold gas spraying, flame spraying.

10. The method of claim 1, wherein forming the porous metal layer over the first region and the second region comprises a printing process.

11. The method of claim 1, wherein the porous metal layer comprises a porosity of less than or equal to about 90%.

12. The method of claim 1, wherein the porous metal layer has a thickness of greater than or equal to about 10 µm.

13. The method of claim 1, wherein the porous metal layer comprises a metal or metal alloy having a melting point of less than or equal to about 1100° C.

14. The method of claim 1, wherein the porous metal layer comprises at least one material selected from the following group of materials, the group consisting of: copper, tin, aluminum, silver, gold, an alloy comprising one or more of the aforementioned materials.

15. The method of claim 1, wherein the adhesive force between the second region and the porous metal layer is such that the porous metal layer peels off the second region after forming the porous metal layer over the second region.

16. The method of claim 1, wherein the first region and the second region are disposed adjacent to one another.

17. The method of claim 1, further comprising removing the porous metal layer from the second region after forming the porous metal layer over the first region and the second region.

18. The method of claim 17, wherein removing the porous metal layer from the second region comprises at least one of the following:
   cleaning the workpiece, wherein cleaning the workpiece comprises at least one of brush cleaning, $CO_2$ snow jet cleaning, or compressed air cleaning;
   cooling the workpiece.

19. The method of claim 17, removing the porous metal layer from the second region comprises mechanical polishing.

20. The method of claim 1, wherein the second region protrudes from the workpiece.

21. The method of claim 1, wherein the second region comprises at least a first subregion and a second subregion protruding from the workpiece, and wherein the first region is disposed between the first subregion and the second subregion of the second region.

22. A method for processing a workpiece, the method comprising:
   providing a workpiece comprising a first region and a second region, wherein the first region comprises a first material and the second region comprises a second material that is different from the first material;
   forming a metal layer over the first region and the second region by means of at least one of a spray coating process, a printing process and a plasma-based deposition process,
   wherein the first material and the second material are configured such that an adhesive force between the second material and the metal layer is lower than an adhesive force between the second material and the metal layer,
   wherein at least one of the following conditions is satisfied:
   1) the adhesive force between the second region and the porous metal layer is such that the porous metal layer detaches from the second region upon application of a force of less than or equal to about 50 $kg/cm^2$ to the porous metal layer in a stamp pull-off test,
   2) the adhesive force between the first region and the porous metal layer is such that the porous metal layer withstands a force of greater than or equal to about 100 $kg/cm^2$ applied to the porous metal layer in a stamp pull-off test, without detaching from the first region.

23. The method of claim 22, wherein the metal layer comprises a plurality of pores.

24. The method of claim 22, wherein forming the metal layer over the first region and the second region comprises a plasma-dust deposition process.

25. A method for processing a workpiece, the method comprising:
   providing a workpiece comprising a first region and a second region;
   forming a porous metal layer over the first region and the second region;
   removing the porous metal layer from the second region after forming the porous metal layer over the first region and the second region,
   wherein the first region and the second region are configured such that an adhesive force between the second region and the porous metal layer is lower than an adhesive force between the first region and the porous metal layer, and
   wherein removing the porous metal layer from the second region comprises at least one of $CO_2$ snow jet cleaning the workpiece, compressed air cleaning the workpiece, and/or cooling the workpiece.

26. A method for processing a workpiece, the method comprising:
   providing a workpiece comprising a first region and a second region;
   forming a porous metal layer over the first region and the second region;
   wherein the first region and the second region are configured such that an adhesive force between the second region and the porous metal layer is lower than an adhesive force between the first region and the porous metal layer,
   wherein the second region comprises at least a first subregion and a second subregion protruding from the workpiece, and wherein the first region is disposed between the first subregion and the second subregion of the second region.

* * * * *